(12) United States Patent
Cho et al.

(10) Patent No.: US 8,330,048 B2
(45) Date of Patent: Dec. 11, 2012

(54) ELECTROMAGNETIC BANDGAP STRUCTURE AND PRINTED CIRCUIT BOARD HAVING THE SAME

(75) Inventors: Won Woo Cho, Busan (KR); Young Soo Kim, Gyeongsangbuk-do (KR); Yoon Jung Kim, Gyeongsangbuk-do (KR); Dek Gin Yang, Chungcheongbuk-do (KR); Myung Gun Chong, Gyeongsangnam-do (KR); Hyung Ho Kim, Incheon (KR)

(73) Assignees: Samsung Electro-Mechanics Co., Ltd., Suwon, Gyunggi-do (KR); Postech Academy-Industry Foundation, Pohang Univ. of Science, Gyeongsangbuk-do (KR)

( * ) Notice: Subject to any disclaimer, the term of this patent is extended or adjusted under 35 U.S.C. 154(b) by 350 days.

(21) Appl. No.: 12/650,486

(22) Filed: Dec. 30, 2009

(65) Prior Publication Data
US 2010/0252319 A1   Oct. 7, 2010

(30) Foreign Application Priority Data
Apr. 7, 2009   (KR) .................. 10-2009-0029964

(51) Int. Cl.
*H05K 9/00* (2006.01)

(52) U.S. Cl. ........ 174/250; 174/256; 174/262; 174/267; 361/763; 361/766; 361/784; 361/816; 361/818; 333/12; 333/22 R; 333/185; 343/700 MS; 343/909

(58) Field of Classification Search .......... 174/250–267, 174/360, 367; 361/722–767, 780–784, 772, 361/790–795, 788; 333/12, 167, 175, 185, 333/246, 202, 204, 212; 343/700 MS, 729, 343/767, 762, 829, 846, 853, 860, 909; 257/532, 257/533, 621, 664, 665, 697, 724, 786
See application file for complete search history.

(56) References Cited

U.S. PATENT DOCUMENTS

| | | | | | |
|---|---|---|---|---|---|
| 3,436,687 | A | * | 4/1969 | Andrews, Jr. et al. | ........ 333/140 |
| 3,718,874 | A | * | 2/1973 | Cooper, Jr. | .................... 333/204 |
| 5,404,118 | A | * | 4/1995 | Okamura et al. | ............. 333/175 |
| 5,610,569 | A | * | 3/1997 | Hwang et al. | ................. 336/200 |
| 5,696,471 | A | * | 12/1997 | Fujiwara | ....................... 333/177 |

(Continued)

FOREIGN PATENT DOCUMENTS
KR        100838244 B1     6/2008
(Continued)

OTHER PUBLICATIONS

Office Action from counterpart Korean Patent Application No. 10-2009-0029964, Dec. 8, 2010, 4 pages.

*Primary Examiner* — Michail V Datskovskiy
(74) *Attorney, Agent, or Firm* — Blakely Sokoloff Taylor & Zafman LLP (57) ABSTRACT

Disclosed herein are an electromagnetic bandgap structure and a printed circuit board having the same. The bandgap structure includes a conductive layer including a plurality of conductive plates; and a metal layer disposed over or under the conductive layer and including a stitching pattern to electrically connect a first conductive plate to a second conductive plate of the plurality of conductive plates. The bandgap structure includes a spiral stitching pattern formed in a metal layer different from the conductive layer, thus offering a stop-band having a desired bandwidth in a compact structure.

8 Claims, 5 Drawing Sheets

U.S. PATENT DOCUMENTS

| | | | | |
|---|---|---|---|---|
| 5,978,231 A * | 11/1999 | Tohya et al. | | 361/782 |
| 6,002,593 A * | 12/1999 | Tohya et al. | | 361/765 |
| 6,091,310 A * | 7/2000 | Utsumi et al. | | 333/12 |
| 6,175,727 B1 * | 1/2001 | Mostov | | 455/307 |
| 6,222,427 B1 * | 4/2001 | Kato et al. | | 333/185 |
| 6,370,033 B1 * | 4/2002 | Saegusa et al. | | 361/777 |
| 6,384,706 B1 * | 5/2002 | Iwanami | | 336/200 |
| 6,384,797 B1 * | 5/2002 | Schaffner et al. | | 343/795 |
| 6,476,771 B1 * | 11/2002 | McKinzie, III | | 343/756 |
| 6,483,481 B1 * | 11/2002 | Sievenpiper et al. | | 343/909 |
| 6,512,494 B1 * | 1/2003 | Diaz et al. | | 343/909 |
| 6,538,621 B1 * | 3/2003 | Sievenpiper et al. | | 343/909 |
| 6,670,921 B2 * | 12/2003 | Sievenpiper et al. | | 343/700 MS |
| 6,806,793 B2 * | 10/2004 | Bhatia et al. | | 333/175 |
| 6,853,350 B2 * | 2/2005 | Alexopoulos et al. | | 343/895 |
| 6,861,899 B2 * | 3/2005 | Konishi | | 327/565 |
| 6,897,831 B2 * | 5/2005 | McKinzie et al. | | 343/909 |
| 6,931,712 B2 * | 8/2005 | Long et al. | | 29/602.1 |
| 6,963,034 B2 * | 11/2005 | Iwanami | | 174/260 |
| 6,970,057 B2 * | 11/2005 | Lin et al. | | 333/177 |
| 6,995,733 B2 * | 2/2006 | Waltho | | 343/909 |
| 7,016,490 B2 * | 3/2006 | Beutler et al. | | 379/412 |
| 7,088,215 B1 * | 8/2006 | Winter et al. | | 336/200 |
| 7,111,271 B2 * | 9/2006 | Li et al. | | 716/137 |
| 7,116,202 B2 * | 10/2006 | Alexopoulos et al. | | 336/200 |
| 7,136,029 B2 * | 11/2006 | Ramprasad et al. | | 343/909 |
| 7,164,933 B1 * | 1/2007 | Steigerwald et al. | | 455/562.1 |
| 7,215,007 B2 * | 5/2007 | McKinzie et al. | | 257/664 |
| 7,423,608 B2 * | 9/2008 | Dunn et al. | | 343/909 |
| 7,492,243 B2 * | 2/2009 | Hidaka et al. | | 333/204 |
| 7,518,248 B2 * | 4/2009 | Li et al. | | 257/774 |
| 7,626,216 B2 * | 12/2009 | McKinzie, III | | 257/192 |
| 7,868,727 B2 * | 1/2011 | Chen et al. | | 336/200 |
| 8,013,258 B2 * | 9/2011 | Wu | | 174/382 |
| 8,134,425 B2 * | 3/2012 | Rofougaran et al. | | 333/174 |
| 2004/0196132 A1 * | 10/2004 | Yu et al. | | 336/223 |
| 2005/0104678 A1 * | 5/2005 | Shahparnia et al. | | 333/12 |
| 2007/0120223 A1 * | 5/2007 | McKinzie et al. | | 257/533 |
| 2009/0002952 A1 * | 1/2009 | Mesmer et al. | | 361/720 |
| 2009/0071709 A1 * | 3/2009 | Han et al. | | 174/360 |
| 2009/0179722 A1 * | 7/2009 | Goyette et al. | | 336/186 |

FOREIGN PATENT DOCUMENTS

KR     1020090029573     3/2009

* cited by examiner

ELECTROMAGNETIC BANDGAP STRUCTURE AND PRINTED CIRCUIT BOARD HAVING THE SAME

CROSS REFERENCE TO RELATED APPLICATION

This application claims the benefit of Korean Patent Application No. 10-2009-0029964, filed on Apr. 7, 2009, entitled "Electromagnetic band gap structure and a printed circuit board comprising the same", which is hereby incorporated by reference in its entirety into this application.

BACKGROUND OF THE INVENTION

1. Field of the Invention

The present invention relates to an electromagnetic bandgap structure, and more particularly to an electromagnetic bandgap structure capable of blocking noise of a specific frequency band and a printed circuit board having the same.

2. Description of the Related Art

With the recent rapid advancement of technologies and services relating to cable and radio broadcasting and communication, the strength of users' demands for products is heightened. In order to realize the reduction in size of products for the sake of portability, an increase in battery performance and multifunctionality of products (which are required to satisfy the above demands), operating speed and bandwidth of electronic products are rapidly being increased. With the increase in operating speed, a clock frequency falls within a GHz range, and thus problems concerned with power integrity (PI), signal integrity (SI) and EMI caused by Simultaneous Switching Noise (SSN) generated from various on/off chips or packages such as digital blocks positioned on a multilayered PCB are emerging as critical issues in PCB design.

SSN, which is also known as a delta-I noise or ground bounce noise, is a source of serious noise on a multilayered PCB. The SSN is caused by time-varying current that rapidly varies in a high-speed digital circuit. SSN, which is generated between a power layer and a ground layer, affects an adjacent signal line, thus not only exerting an influence on signal integrity (SI) but also causing radiation of electromagnetic waves at a peripheral region of a PCB.

More specifically, when a lot of switching devices are switched concurrently, high-speed current passing through vias between multilayered PCBS causes propagation of an undesired electromagnetic wave through a substrate. Since the generated electromagnetic waves may affect transmission characteristics of a signal passing through vias, the electromagnetic waves may serve as a noise source affecting other devices and may increase EMI radiated from a peripheral region of a PCB to the outside.

Figure 1:
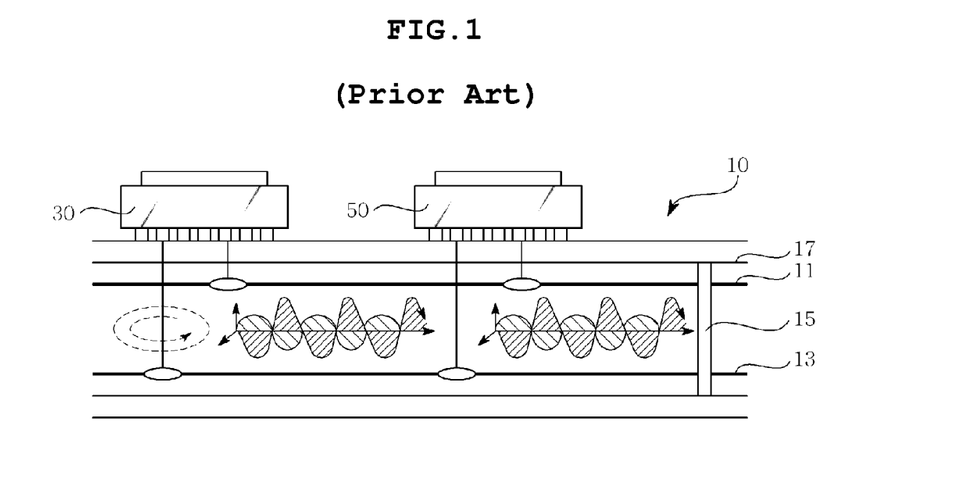
FIG. 1 is a schematic cross-sectional view of a printed circuit board on which two different electronic circuits with different operating frequencies are mounted.

FIG. 1 is a schematic cross-sectional view of a printed circuit board 10 on which two different electronic circuits 30 and 50 are mounted. The printed circuit board 10 includes power and ground layers 11 and 13 for supplying power to the two electronic circuits 30 and 50, signal lines 17 and a via 15 for signal transmission between the signal lines 17.

As shown in the drawing, when the electronic circuits 30 and 50 operating at different frequencies are mounted on a printed circuit board, electromagnetic waves caused by an operating frequency and harmonic components of one of the two electronic circuits are transmitted to the other electronic circuit and interfere with electromagnetic waves originating from the other electronic circuit, thus causing noise.

The most typical solution to solve the problems of influencing PI and SI and EMI, which occur as a result of the SSN generated from a high-speed digital system, is to connect a decoupling capacitor between the power layer and the ground layer. In addition, since a feedback current pathway having low impedance is provided through the decoupling capacitor, noise propagated through parallel conductive plates can be blocked. However, in order to reduce SSN for a lot of vias, there is a need for a lot of decoupling capacitors, which increases both production costs and an area of a PCB occupied by the decoupling capacitors, thus restricting the free arrangement of other elements on the PCB. Furthermore, parasitic impedance of the decoupling capacitors causes another problem of parallel resonance. Therefore, the decoupling capacitors are not so efficient in reducing noise occurring from a PCB in a high-frequency band of 1 GHz or more which is causing trouble for recent high-speed digital systems.

For this reason, research on an electromagnetic bandgap (EBG) structure which is capable of selecting a frequency so as to solve the problems of SSN occurring in the GHz band is being intensively conducted. The electromagnetic bandgap structure cannot only solve the problem of SSN using the characteristic in which high impedance occurs in a specific frequency band but can also solve problems such as the increased cost resulting from use of the decoupling capacitors and the restriction in free arrangement of elements.

Among EBGs, a mushroom type EBG structure and a planar type EBG structure are typically known in the art. However, the conventional EBG structures have disadvantages in to that they are hard to design so as to have a stopband at a desired size which is small enough to be incorporated in a compact electronic device such as a cellular phone.

Accordingly, in response to the above problems, development of an EBG structure which can be reduced in size is eagerly required.

SUMMARY OF THE INVENTION

Accordingly, the present invention has been made keeping in mind the above problems occurring in the prior art, and the present invention proposes an electromagnetic bandgap structure which can be reduced in size and can provide a desired frequency response characteristics.

In an aspect, the present invention provides an electromagnetic bandgap structure including: a conductive layer including a plurality of conductive plates; and a metal layer disposed over or under the conductive layer and including a stitching pattern to electrically connect a first conductive plate to a second conductive plate of the plurality of conductive plates.

The electromagnetic bandgap structure may further include: a dielectric layer disposed between the conductive layer and the metal layer; a first via penetrating through the dielectric layer so as to form an electrical connection between the first conductive plate and the stitching pattern; and a second via penetrating through the dielectric layer so as to form an electrical connection between the second conductive plate and the stitching pattern.

The conductive layer may include a peripheral part surrounding the plurality of conductive plates with clearances formed therebetween.

The metal layer may include a peripheral part surrounding the stitching pattern with clearances formed therebetween.

All the plurality of conductive plates may be electrically connected to each other through the stitching pattern.

The conductive layer may be a power layer or a ground layer.

The peripheral part may be electrically connected to the plurality of conductive plates.

In another aspect, the present invention provides an electromagnetic bandgap structure including: a plurality of conductive plates; and a stitching via electrically connected between the plurality of conductive plates, and including a spiral pattern formed in a metal layer different from a layer composed of the plurality of conductive plates.

In a further aspect, the present invention provides a printed circuit board including: two electronic circuits with different operating frequencies; and an electromagnetic bandgap structure comprising: a conductive layer including a plurality of conductive plates; and a metal layer disposed over or under the conductive layer and including a stitching pattern to electrically connect a first conductive plate to a second conductive plate of the plurality of conductive plates.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Hereinafter, a printed circuit board having round solder bumps according to the present invention will be described in greater detail with reference to the accompanying drawings. Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 2:
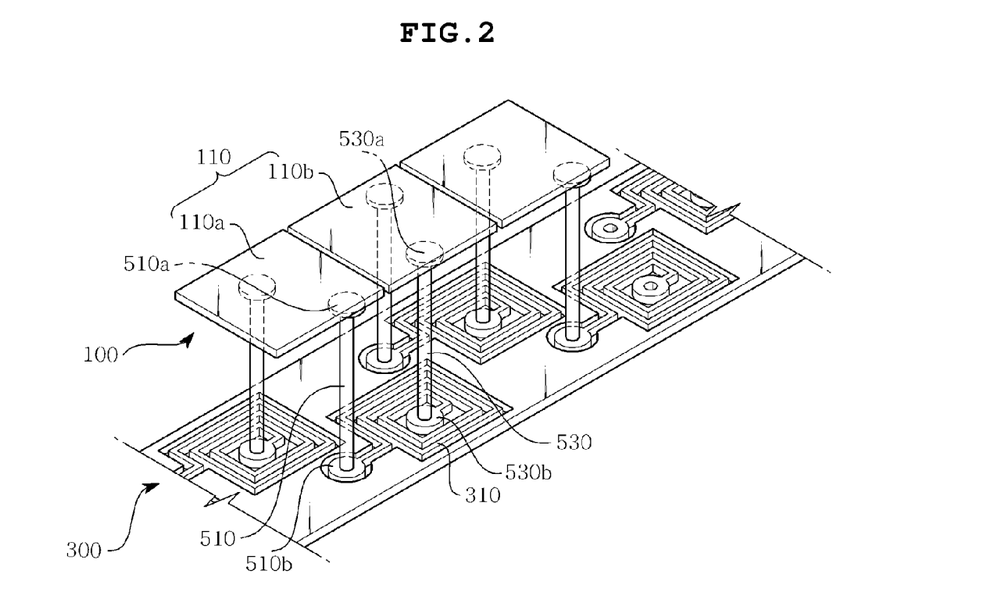
FIG. 2 is a schematic view showing an electromagnetic bandgap structure according to an embodiment of the present invention.
Figure 3:
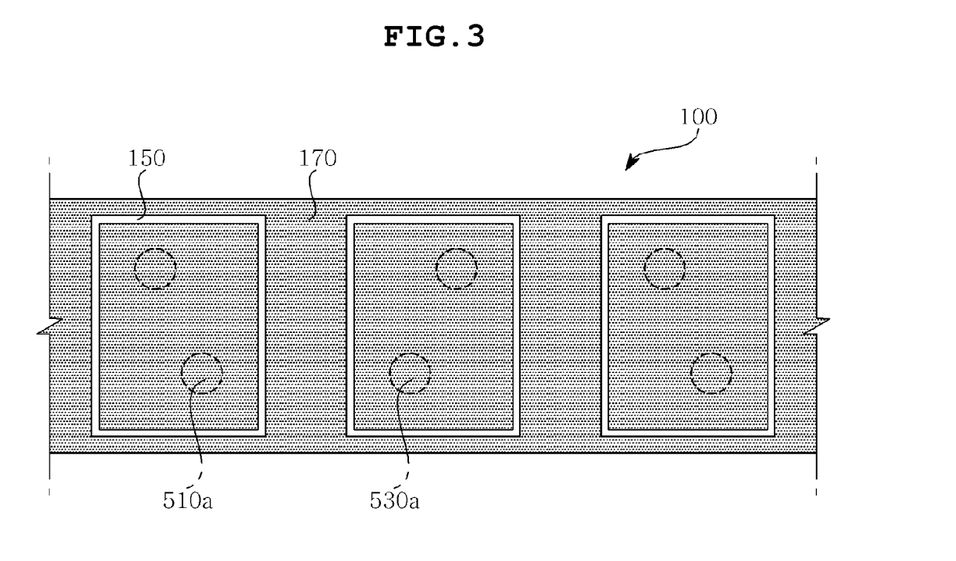
FIG. 3 is a plan view showing a conductive layer of the electromagnetic bandgap structure shown in FIG. 2.
Figure 4:
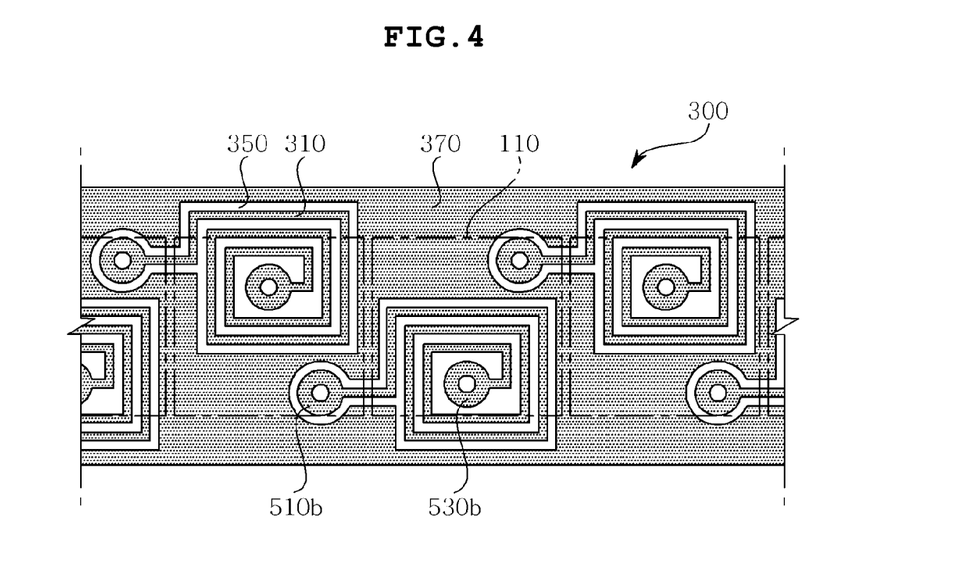
FIG. 4 is a plan view showing a metal layer of the electromagnetic bandgap structure shown in FIG. 2.
Figure 5:
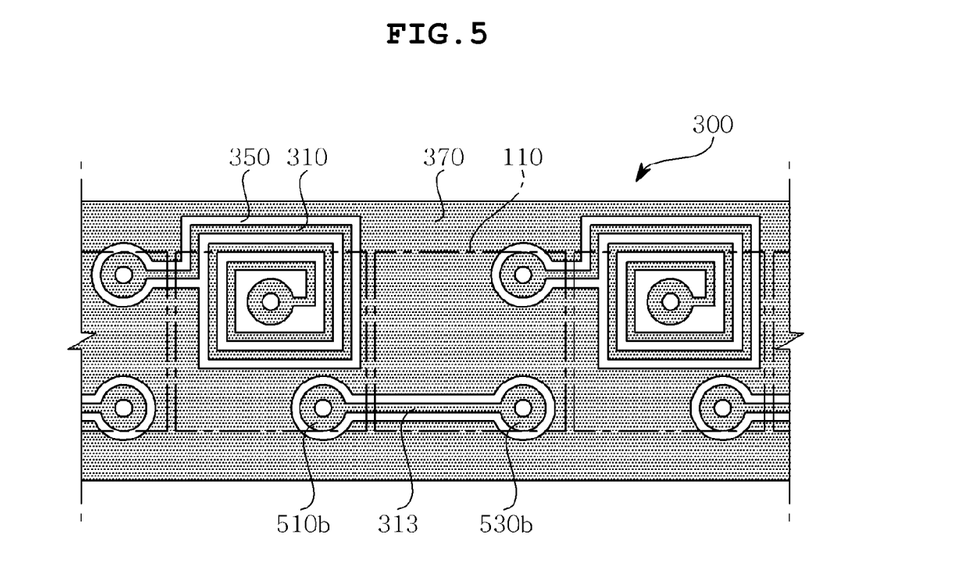
FIG. 5 is a plan view showing a modification of the metal layer of the electromagnetic bandgap structure shown in FIG. 2.

FIG. 2 is a schematic view showing an electromagnetic bandgap structure according to an embodiment of the present invention, FIG. 3 is a plan view showing a conductive layer 100 of the electromagnetic bandgap structure shown in FIG. 2, FIG. 4 is a plan view showing a metal layer 300 of the electromagnetic bandgap structure shown in FIG. 2, and FIG. 5 is a plan view showing a modification of the metal layer 300 of the electromagnetic bandgap structure shown in FIG. 2. In FIG. 2, some of components of the bandgap structure are omitted for the sake of providing a clear explanation of the present invention.

As shown in FIG. 2, the bandgap structure according to this embodiment of the present invention comprises a conductive layer 100 including a plurality of conductive plates 110, and a metal layer 300 disposed over or under the conductive layer 100 and including spiral stitching to patterns 310 one of which is adapted to electrically connect a first conductive plate 110a of the plurality of conductive plates to a second conductive plate 110b of the plurality of conductive plates.

In this regard, a dielectric layer, which is disposed between the conductive layer 100 and the metal layer 300, is omitted from the drawing for the sake of providing a clear illustration. The dielectric layer may be made of insulating material, such as prepreg including epoxy resin, which is typically used for the interlayer insulating of the printed circuit board.

The conductive layer 100 is made of electrically conductive material, and may be a metal layer made of electrically conductive metal such as gold, silver, copper and the like. The conductive layer 100 may be a power layer or a ground layer formed on the printed circuit board.

The conductive layer 100 is composed of the plurality of conductive plates 110 which are arranged with spacings therebetween. Although the conductive layer 100 may be composed of only conductive plates which are separated from each other, it may further include a peripheral part 170 which has clearances defined between the peripheral part and the conductive plates, as shown in FIG. 3.

The plurality of conductive plates 110 are separated and insulated from each other in the conductive layer 100, and are electrically connected to each other via the stitching patterns 310. More specifically, as appreciated from FIG. 2, the first conductive plate 110a of the plurality of conductive plates 110 is electrically connected to the second conductive plate 110b of the plurality of conductive plates 110 through a first via 510, the stitching pattern 310 and a second via 530 in this order. The vias and the stitching patterns, which are disposed between the first conductive plate 110a and the second adjacent conductive plate 110b, may be collectively referred to as a stitching via. All members of the plurality of conductive plates 110 formed in the conductive layer 100 are electrically connected to each other through the stitching vias. In this embodiment, the conductive plates 110 are also electrically connected to the peripheral part 170 included in the conductive layer 100 through the stitching vias.

Figure 7:
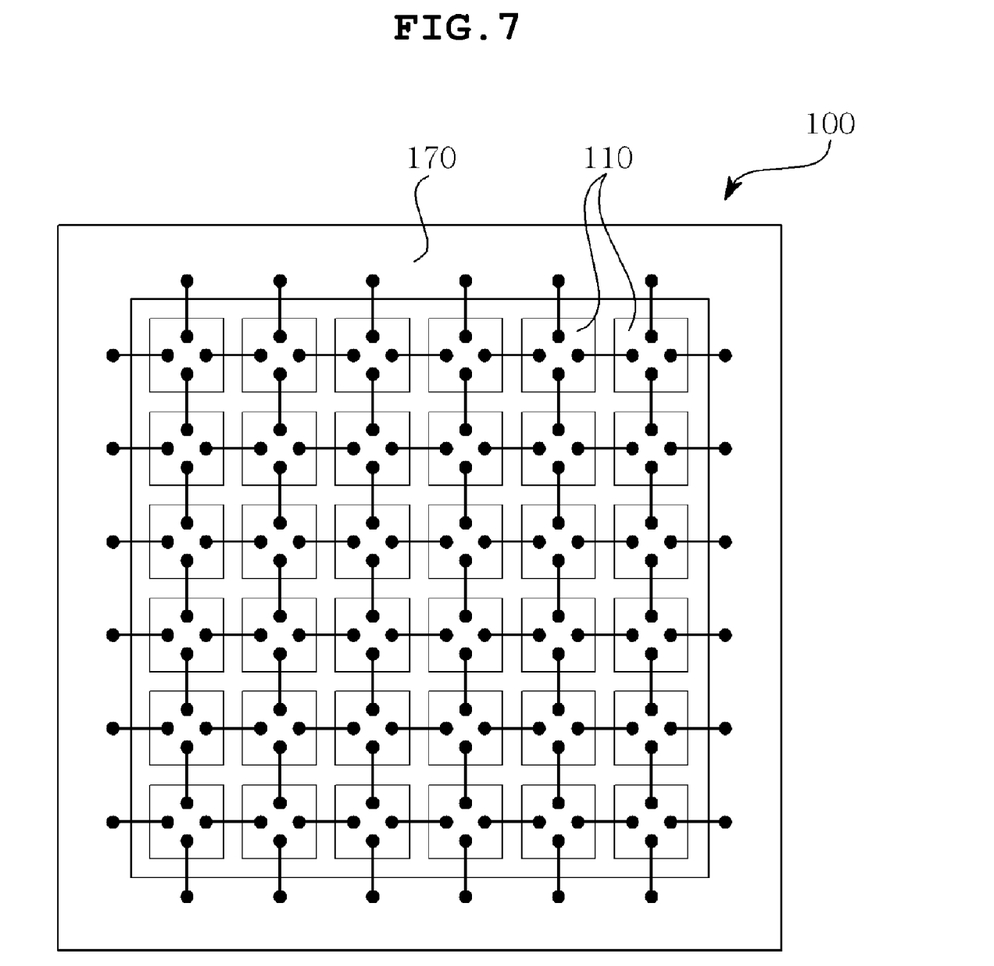
FIG. 7 is a plan view showing a conductive layer which is composed of a plurality of conductive plates and a peripheral part.

FIG. 7 illustrates the conductive layer 100 which is composed of the plurality of conductive plates 110 and the peripheral part 170. As shown in the drawing, the plurality of conductive plates 110 is electrically connected to the peripheral part 170 through the stitching vias.

Although the conductive plates 110 illustrated in this embodiment are shown as having only the same rectangular shape, the conductive plates 110 may have any one of various shapes such as circular, triangular or hexagonal shapes other than the rectangular shape. Accordingly, the scope of the present invention should not be construed as being limited to the above shape shown in the drawing. Furthermore, the plurality of conductive plates does not need to be of the same size, and may be of various different sizes. In addition, all the plurality of conductive plates does not necessarily need to be formed in the same layer, and may be formed in different layers with stitching vias connected therebetween.

Referring to FIG. 4, the metal layer 300 is composed of spiral stitching patterns 310. Like the conductive layer 100, the metal layer 300 may also be made of electrically conductive material, for example, gold, silver, copper and the like.

In this regard, although the metal layer 300 may be composed of only the stitching patterns 310 which are separated from each other, it may further include a peripheral part 370 which has clearances 350 defined between the peripheral part and the stitching patterns 310. At this point, the peripheral part 370 and the stitching patterns 310 are electrically insulated from each other. The peripheral part 370 may serve as a power layer or a ground layer in the printed circuit board.

Each of the stitching patterns 310 is electrically connected at one end thereof to a lower land 510b of the first via 510, and is electrically connected at the other end thereof to a lower land 530b of the second via 530. The first via 510 penetrates through the dielectric layer so as to connect the upper land 510a of the first via 510 formed in the first conductive plate 110a with the lower land 510b of the first via 510 formed in the metal layer 300. In other words, the first via 510 functions to electrically connect the first conductive plate 110a to the stitching pattern 310. Meanwhile, the second via 530 penetrates through the dielectric layer so as to connect the upper land 530a of the second via 530 formed in the second conductive plate 110b with the lower land 530b of the second via 510 formed in the metal layer 300. In other words, the second via 530 functions to electrically connect the second conductive plate 110b to the stitching pattern 310.

The first via 510 and the second via 530 may be composed of a plating layer formed on to an internal surface of a via-hole formed in the dielectric layer or of conductive filler (plating filler, conductive paste, etc.) which is charged in a via-hole formed in the dielectric layer.

The stitching pattern 310 may include a pattern part which is configured to have a spiral shape. More specifically, the stitching pattern 310, which is connected between the lower land 510b of the first via 510 and the lower land 530b of the second via 530, may be connected in a curved manner between the lower land 510b of the first via 510 and the upper land 530a of the second via 530 so as to have a longer electrical connection, rather than being connected in a linear manner therebetween. All the stitching patterns 310 do not need to have the same shape, and may include a linear stitching pattern 313, as shown in FIG. 5.

Figure 6:
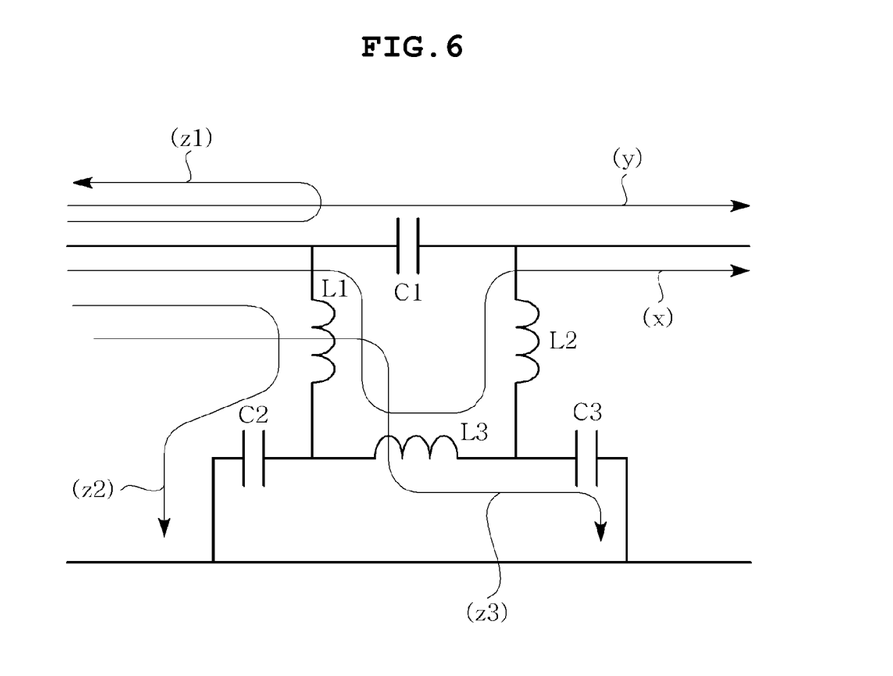
FIG. 6 is an equivalent circuit schematic of the electromagnetic bandgap structure according to the embodiment of the present invention.

Referring to FIG. 6, there is shown an equivalent circuit schematic of the electromagnetic bandgap structure which is constructed in the above-described manner. The equivalent circuit schematic shown in FIG. 6 illustrates an embodiment in which the metal layer 300 includes the peripheral part 370. In the comparison of the electromagnetic bandgap structure shown in FIG. 2 with the equivalent circuit schematic shown in FIG. 6, an inductance component L1 corresponds to the first via 510, an inductance component L2 corresponds to the second via 530, and an inductance component L3 corresponds to the stitching pattern 310. Character "C1" represents a capacitance component caused by the conductive layer 100 and other dielectric and metal layers disposed on the conductive layer 100, and characters "C2" and "C3" represent a capacitance component caused by the peripheral part 370 and other dielectric and metal layers disposed under the peripheral part 370.

As shown in the drawing, in order for the electromagnetic bandgap structure to have a stop-band of a desired bandwidth, the inductance component L3 caused by the stitching pattern 310 must be sufficiently provided. To meet the requirement, the stitching pattern 310 must be sufficiently long. In this case, when the stitching patterns 310 are linearly configured, a size of the electromagnetic bandgap structure is inevitably increased. Consequently, the stitching patterns 310 having the increased size can be accommodated in the electromagnetic bandgap structure only when a size of the conductive plates 110 or a spacing between the conductive plates 110 is increased.

Accordingly, in order to realize provision of a sufficient inductance value and a compact bandgap structure, the stitching pattern 310 should not be configured to have a linear to shape but should have a nonlinear pattern such as a spiral shape. Particularly, as shown in FIGS. 2, 4 and 5, it is experimentally proven that the most efficient configuration of the stitching patterns 310 has a spiral shape.

Consequently, the spiral configuration of the stitching patterns 310 results in reduction in size of the electromagnetic bandgap structure.

Figure 8:
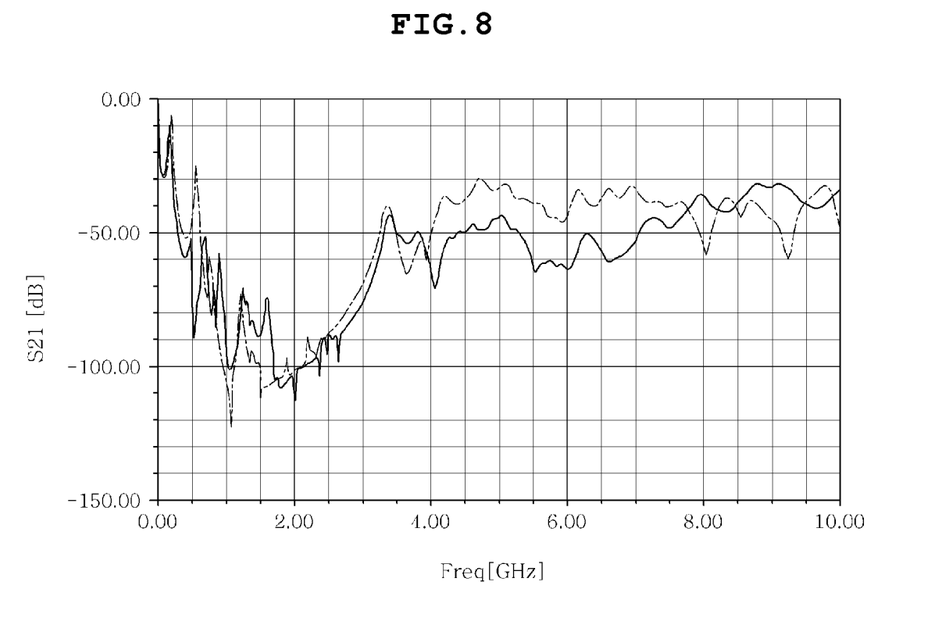
FIG. 8 is a graph showing frequency response characteristics of the electromagnetic bandgap structure according to the embodiment of the present invention.

FIG. 8 is a graph showing frequency response characteristics of the electromagnetic bandgap structure according to this embodiment. Referring to the graph, frequency response characteristics of the electromagnetic bandgap structure which is constructed of the conductive plates 110 having a dimension of 1 mm×1 mm and the spiral stitching patterns 310 can be appreciated.

Referring to FIG. 8, it will be noted that the stop-band appears at a signal frequency band of 0.67 GHz-3.3. GHz when noise is at a value of −60 dB. In other words, this embodiment can provide the electromagnetic bandgap structure which is capable of forming the stop-band of a desired bandwidth using a small cell size of 1 mm×1 mm.

The electromagnetic bandgap structure according to this embodiment includes stitching patterns 310 formed in the metal layer 300 different from the conductive layer 100, and thus enables realization of the stop-band of a desired bandwidth in a compact structure.

Even though a printed circuit board including the electromagnetic bandgap structure according to this embodiment accommodates a large number of electronic circuits, there is no electromagnetic interference between the electronic circuits, thus drastically reducing the occurrence of noise.

As described above, the electromagnetic bandgap structure according to the present invention includes spiral stitching patterns formed in the metal layer different from the conductive layer, thus enabling formation of a stop-band of a desired bandwidth in a compact structure even if it includes a large number of electronic circuits.

Furthermore, a printed circuit board including the electromagnetic bandgap structure according to the present invention can drastically reduce noise generation without electromagnetic interference between electronic circuits even if it includes a large number of electronic circuits.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An electromagnetic bandgap structure comprising:
   a conductive layer including a plurality of conductive plates; and
   a metal layer disposed over or under the conductive layer and including a spiral stitching pattern to electrically connect a first conductive plate to a second conductive plate of the plurality of conductive plates.

2. The electromagnetic bandgap structure according to claim 1, further comprising:
   a dielectric layer disposed between the conductive layer and the metal layer;
   a first via penetrating through the dielectric layer so as to form an electrical connection between the first conductive plate and the stitching pattern; and
   a second via penetrating through the dielectric layer so as to form an electrical connection between the second conductive plate and the stitching pattern.

3. The electromagnetic bandgap structure according to claim 1, wherein the conductive layer includes a peripheral part surrounding the plurality of conductive plates with clearances formed therebetween.

4. The electromagnetic bandgap structure according to claim 1, wherein the metal layer includes a peripheral part surrounding the stitching pattern with clearances formed therebetween.

5. The electromagnetic bandgap structure according to claim 1, wherein all the plurality of conductive plates are electrically connected to each other through the stitching pattern.

6. The electromagnetic bandgap structure according to claim 1, wherein the conductive layer is a power layer or a ground layer.

7. The electromagnetic bandgap structure according to claim 3, wherein the peripheral part is electrically connected to the plurality of conductive plates.

8. An electromagnetic bandgap structure comprising:
   a plurality of conductive plates; and
   a stitching via electrically connected between the plurality of conductive plates, and including a spiral pattern formed in a metal layer different from a layer composed of the plurality of conductive plates.

* * * * *